(12) United States Patent
Hwang et al.

(10) Patent No.: US 11,489,273 B2
(45) Date of Patent: Nov. 1, 2022

(54) ELECTRICAL CONNECTOR EQUIPPED WITH RETENTION MECHANISM FOR SECURING CPU THERETO

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventors: Tzu-Yao Hwang, New Taipei (TW); Ming-Lun Szu, New Taipei (TW)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

(*) Notice: Subject to any disclaimer, the term of this patent is extended or adjusted under 35 U.S.C. 154(b) by 34 days.

(21) Appl. No.: 17/116,324

(22) Filed: Dec. 9, 2020

(65) Prior Publication Data
US 2021/0175647 A1 Jun. 10, 2021

(30) Foreign Application Priority Data
Dec. 9, 2019 (CN) .......................... 201911248136.3

(51) Int. Cl.
| | |
|---|---|
| H01R 12/58 | (2011.01) |
| H01R 13/639 | (2006.01) |
| H05K 7/14 | (2006.01) |
| H01R 12/71 | (2011.01) |
| H05K 7/10 | (2006.01) |
| H01R 12/70 | (2011.01) |

(52) U.S. Cl.
CPC ....... *H01R 12/585* (2013.01); *H01R 12/7076* (2013.01); *H01R 12/714* (2013.01); *H01R 13/639* (2013.01); *H05K 7/1007* (2013.01); *H05K 7/1405* (2013.01)

(58) Field of Classification Search
CPC .............. H01R 12/585; H01R 12/7076; H01R 12/899; H05K 7/1007
USPC .................................................. 439/330, 342
See application file for complete search history.

(56) References Cited

U.S. PATENT DOCUMENTS

| | | | | |
|---|---|---|---|---|
| 3,877,064 A * | 4/1975 | Scheingold | .......... | H05K 7/1069 361/776 |
| 4,266,840 A * | 5/1981 | Seidler | ................. | H05K 7/1007 439/330 |
| 4,676,571 A * | 6/1987 | Petersen | .............. | H05K 7/1046 439/261 |

(Continued)

*Primary Examiner* — Neil Abrams
(74) *Attorney, Agent, or Firm* — Ming Chieh Chang

(57) ABSTRACT

An electrical connector assembly includes an electrical connector and a CPU. The electrical connector includes an insulative housing defining a receiving cavity, and a plurality of contacts retained to the housing with corresponding contacting sections exposed in the receiving cavity. A first securing piece is attached upon the CPU, and a second securing piece is attached upon the housing. When the CPU is received within the receiving cavity, the first securing piece is locked with the second securing piece so as to have the CPU retained to the connector in position wherein the corresponding contacts of the electrical connector are mechanically and electrically connected to the corresponding contacting pads of the CPU in a compression manner reliably.

20 Claims, 8 Drawing Sheets

(56) References Cited

U.S. PATENT DOCUMENTS

| | | | | | |
|---|---|---|---|---|---|
| 4,692,790 | A | * | 9/1987 | Oyamada | H05K 7/1061 439/71 |
| 5,039,128 | A | * | 8/1991 | Romuno | F21V 33/008 362/253 |
| 5,059,128 | A | * | 10/1991 | Murphy | H05K 7/1084 439/708 |
| 5,411,400 | A | * | 5/1995 | Subrahmanyan | H05K 7/1053 361/636 |
| 6,773,290 | B2 | * | 8/2004 | Lai | H01R 12/88 439/342 |
| 7,175,462 | B2 | * | 2/2007 | Hashimoto | H01R 12/89 439/259 |
| 7,347,713 | B2 | * | 3/2008 | Boudreaux | H01R 12/89 439/342 |
| 7,661,976 | B2 | * | 2/2010 | Ma | H01R 12/89 439/342 |
| 8,292,633 | B2 | * | 10/2012 | Ju | H01R 12/7076 439/74 |
| 8,292,646 | B2 | * | 10/2012 | Hsu | G06K 13/0862 439/325 |
| 8,587,947 | B2 | * | 11/2013 | Yonemochi | H01L 23/4093 439/70 |
| 8,801,439 | B2 | * | 8/2014 | Sato | H01R 24/76 439/71 |
| 9,093,802 | B2 | | 7/2015 | Honhai | |
| 9,668,344 | B2 | * | 5/2017 | Jung | H01L 24/81 |
| 9,806,444 | B1 | | 10/2017 | Lotes | |
| 2021/0175647 | A1 | * | 6/2021 | Hwang | H05K 7/1069 |

* cited by examiner

ELECTRICAL CONNECTOR EQUIPPED WITH RETENTION MECHANISM FOR SECURING CPU THERETO

FIELD OF THE DISCLOSURE

The invention is related to an electrical connector assembly, and particularly to an electrical connector equipped with retention mechanism to securing a CPU (Central Processing Unit) thereto.

DESCRIPTION OF RELATED ARTS

U.S. Pat. No. 9,806,444 discloses the electrical connector to receive a CPU. Recently, more contacts are required for high speed transmission. Understandably, the more contacts the connector has, the more reaction forces the connector generates. Therefore, the connector with the great contact number tends to be in a tensioned and unstable manner with regard to the CPU, thus resulting in relative difficulty in a reliable design. The traditional design is to use a heat sink imposed upon an upper face of the CPU to apply the downward force thereon so as to have the contacting pads of the CPU mechanically and electrically connect the corresponding contacts of the electrical connector, respectively. Anyhow, the downward force applied upon the upper face of the CPU may not efficiently transfer the corresponding downward forces to the corresponding contacts.

It is desired to provide an auxiliary retention mechanism between the CPU and the electrical connector directly to assure a reliable connection between the contacting pads of the CPU and the contacts of the electrical connector, in addition to a heat sink clip which imposes a downward force to cooperate with the electrical connector for sandwiching the CPU therebetween in the vertical direction.

SUMMARY OF THE DISCLOSURE

To achieve the objectives, an electrical connector assembly includes an electrical connector and a CPU. The electrical connector includes an insulative housing defining a receiving cavity, and a plurality of contacts retained to the housing with corresponding contacting sections exposed in the receiving cavity. A first securing piece is attached upon the CPU, and a second securing piece is attached upon the housing. When the CPU is received within the receiving cavity, the first securing piece is locked with the second securing piece so as to have the CPU retained to the connector in position wherein the corresponding contacts of the electrical connector are mechanically and electrically connected to the corresponding contacting pads of the CPU in a compression manner reliably.

DETAILED DESCRIPTION OF THE PREFERRED EMBODIMENT

Figure 1:
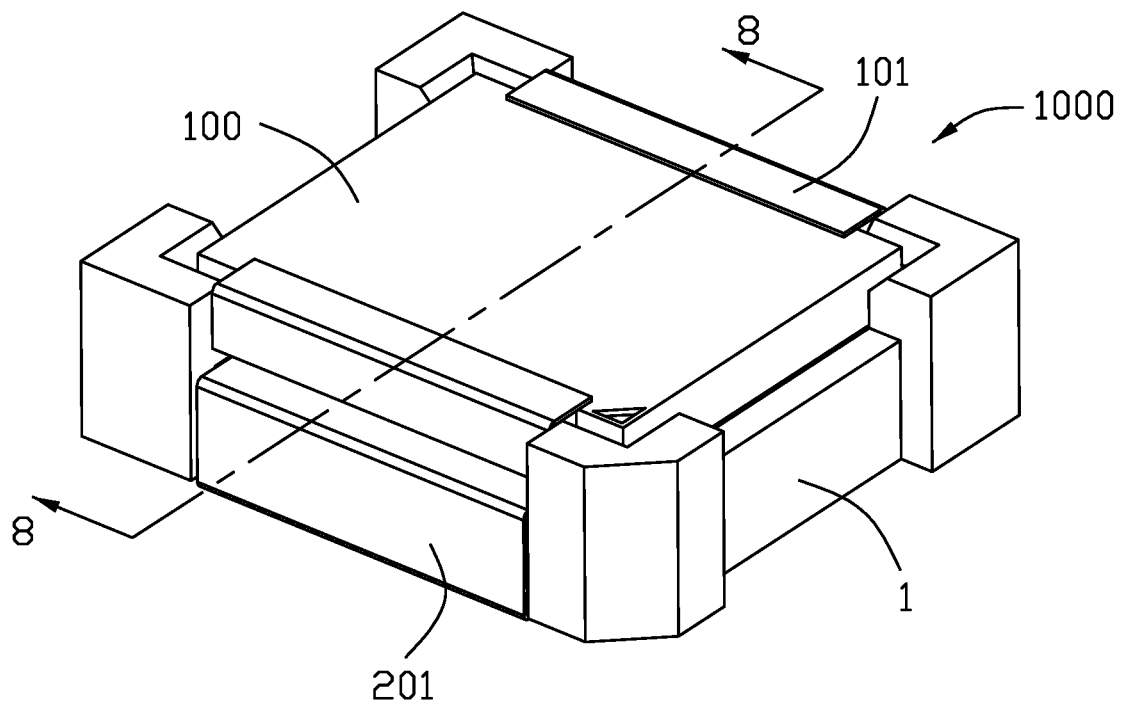
FIG. 1 is a perspective view of an electrical connector assembly including an electrical connector and the CPU therein according to the invention.
Figure 2:
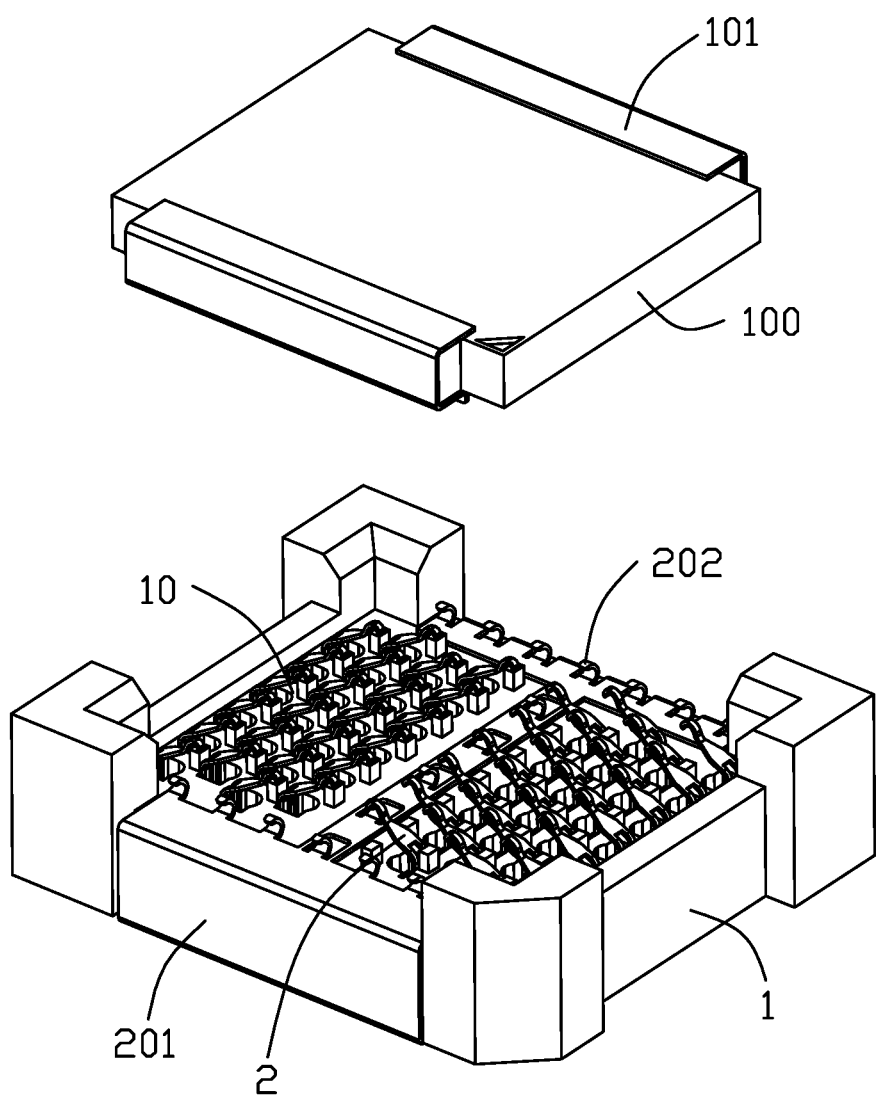
FIG. 2 is a perspective view of the electrical connector assembly of FIG. 1 wherein the CPU is removed away from the electrical connector.
Figure 3:
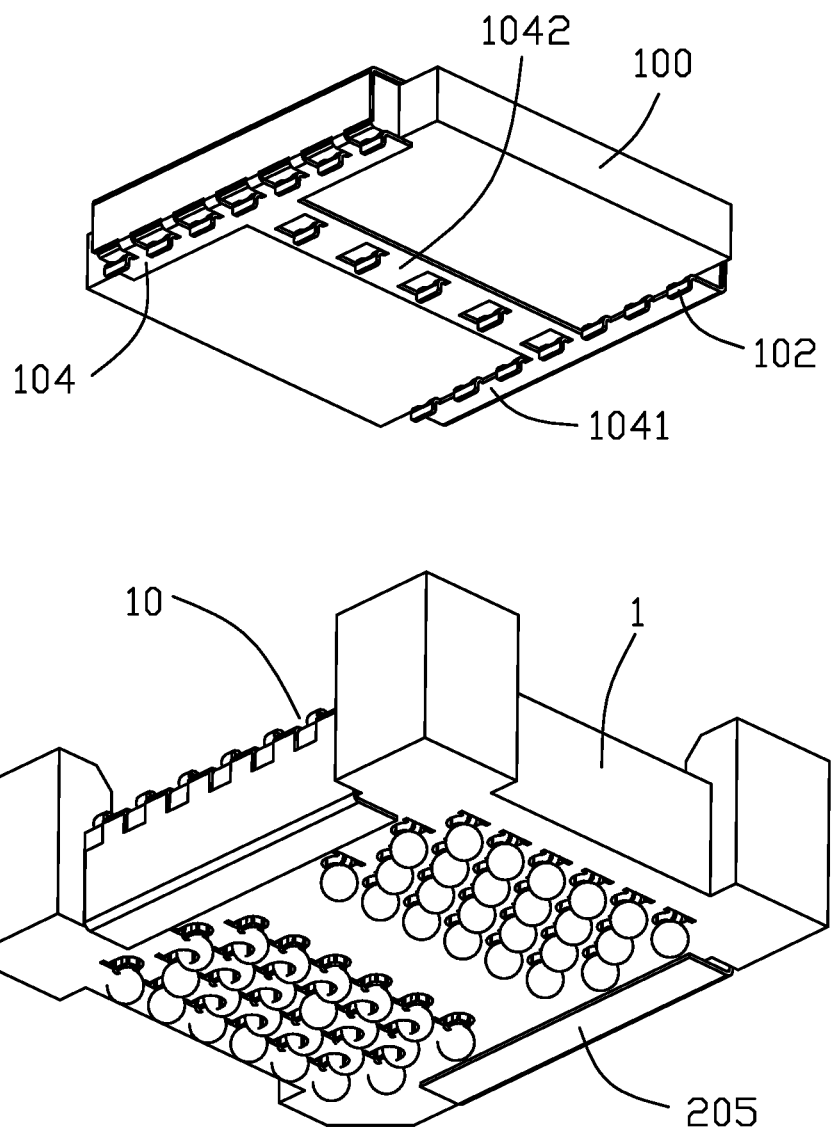
FIG. 3 is another perspective view of the electrical connector assembly of FIG. 2.
Figure 4:
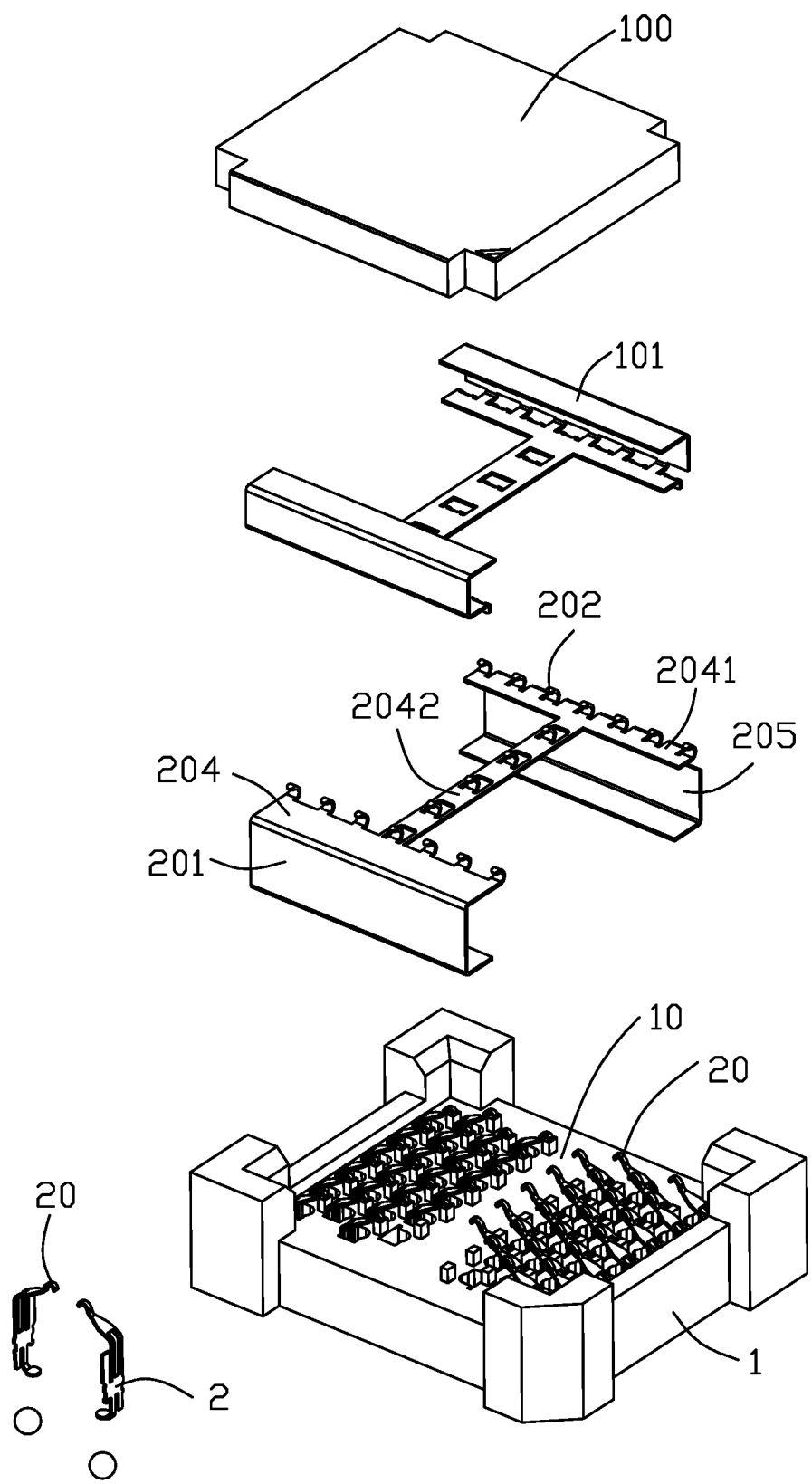
FIG. 4 is an exploded perspective view of the electrical connector assembly of FIG. 2.
Figure 5:
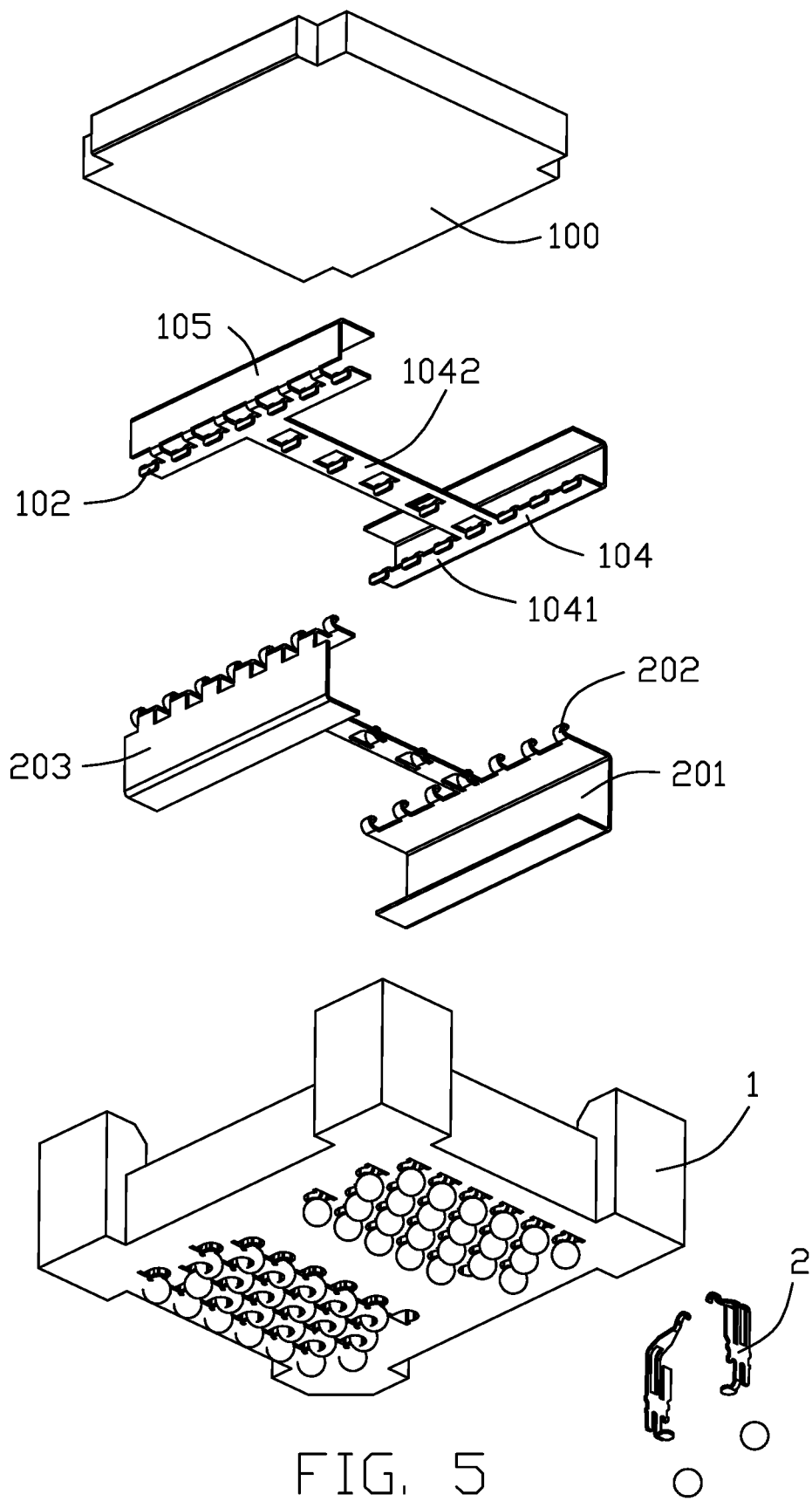
FIG. 5 is another exploded perspective view of the electrical connector assembly of FIG. 4.

An electrical connector assembly 1000 for mounting upon a printed circuit board (not shown), includes an electrical connector 200 and a CPU or an electronic package 100 received within the electrical connector 200. The electrical connector 200 includes an insulative housing 1, and plurality of contacts 2 retained in the housing 1. The housing 1 forms a receiving cavity 10 to receive the CPU 100. The contacts 2 includes a contacting section 20 extending into the receiving cavity 10 for mechanically and electrically connecting to the CPU 100. The CPU 100 is equipped with a first securing piece 101 thereon, and the housing is equipped with a second securing piece 201. The CPU 100 is mated within the electrically connector 200 with the first securing piece 101 of the CPU 100 and the second securing piece 201 of the electrical connector 200 engaged with each other to form the securing mechanism 300. Because the material of the securing mechanism is much stronger than that of the contacts 2, the contacts 2 may endure less stress from the downward force derived from the heat sink assembly, compared with the traditional design without such securing mechanism.

The second securing piece 201 includes a plurality of hooks or curved extensions 22, and the first securing piece 101 includes a plurality of downwardly extending tabs or vertical extensions 102 each forming a locking hole 1020 to receive the corresponding hook 22. The first securing piece 101 and the second securing piece 201 can be assembled with each other via a tiny horizontal movement or a rotational movement of the CPU 100 and the associated first securing piece 101 with regard to the housing 1 and the associated second securing piece 201. Understandably, if the hook 22 extends in an excessive curved configuration, there should be a tiny displacement of the CPU 100 relative to the connector 200 in the vertical direction during loading/unloading of the CPU 100 upon the connector 200 in addition to the horizontal/rotational movement.

Figure 6:
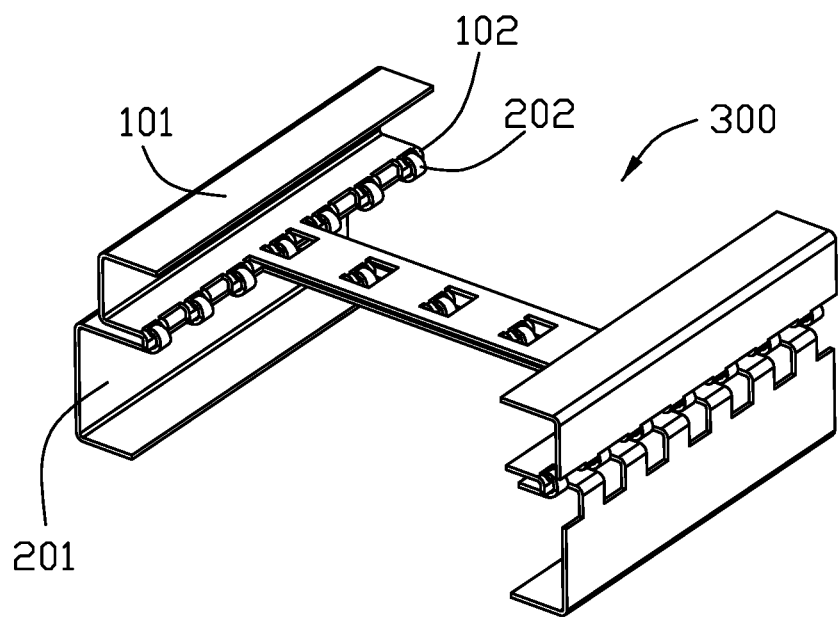
FIG. 6 is a perspective view of the securing mechanism of the electrical connector assembly of FIG. 1 in an assembled manner.
Figure 7:
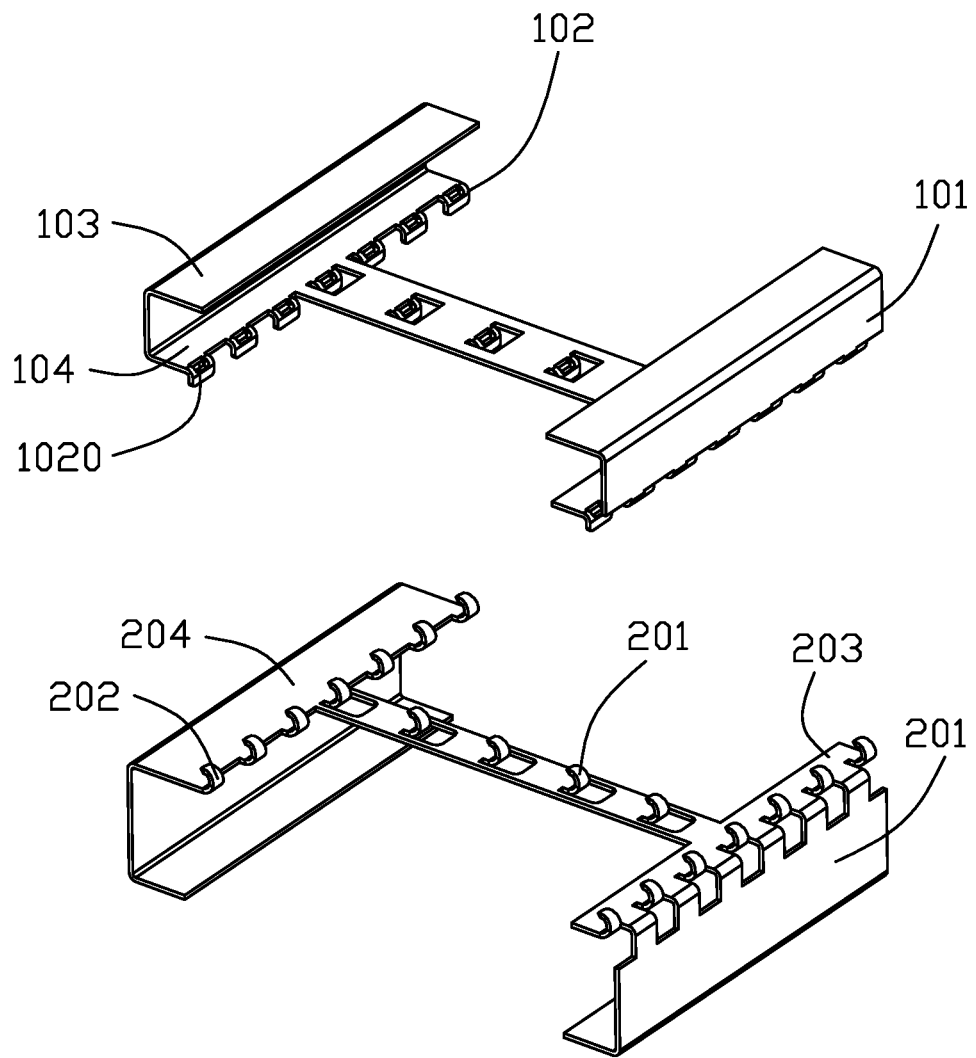
FIG. 7 is a perspective view of the securing mechanism of the electrical connector assembly of FIG. 6 in a separated manner.
Figure 8:
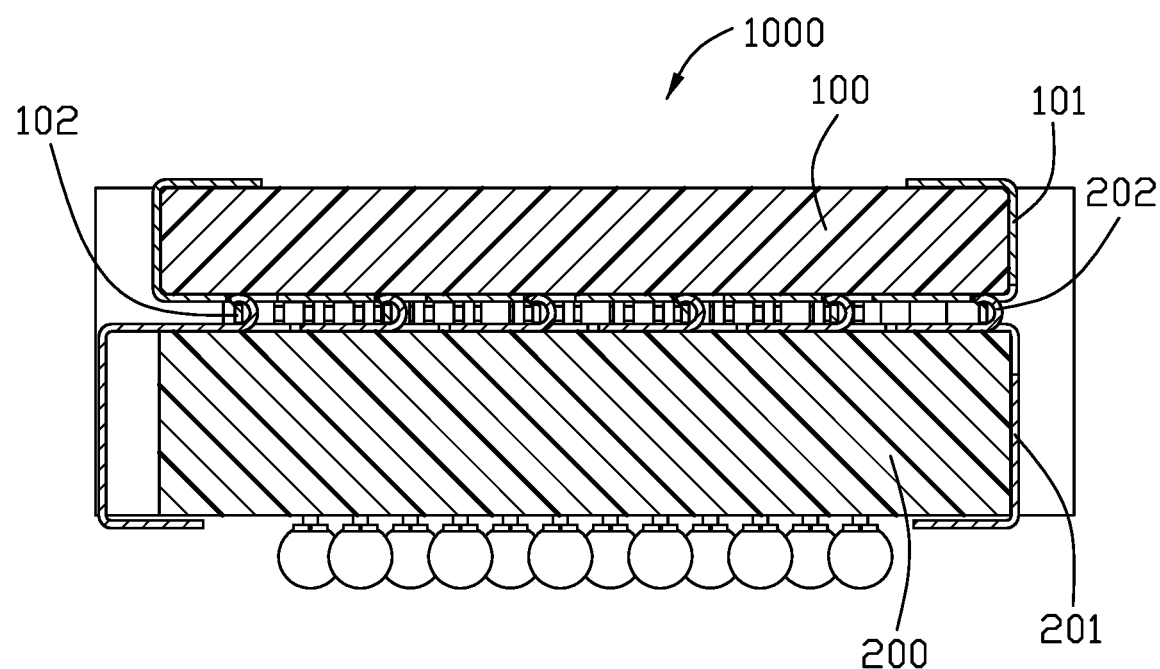
FIG. 8 is a cross-sectional view of the electrical connector assembly of FIG. 1.

As shown in FIGS. 6 and 7, the second securing piece 201 is formed by metal and includes a pair of side arms 203 linked with a transverse bar 2042 (not labeled) to form an H-shaped configuration in a top view. Each side arm 203 includes an upper portion 2041. The hooks 202 are formed on the upper side 204 of the second securing piece 201 which includes the upper portions 2041 of the side arms 203, and the transverse bar 2042 so as to disperse the stress for avoiding warpage of the CPU 100 or the housing 1 under a relatively large force. Each side arm 203 forms a U-shaped structure 205 to snugly receive the side portion of the housing 10.

Referring to FIGS. 2-7, the first securing piece 101 is formed by metal and includes a pair of side arms 103 linked with a transverse bar 1042 to form an H-shaped configuration in a top view. The tabs 102 are formed on a lower side 104 of the first securing piece 101 which includes the lower portion 1041 of the side arms 103, and the transverse bar 1042 so as to disperse the stress for avoiding warpage of the CPU 100 or the housing 1 under a relatively large force.

Each side arm 103 forms a U-shaped structure 105 to snugly receive a side portion of the CPU 100.

In brief, the feature of the invention is to provide a direct securing effect between the CPU 100 and the connector 200 in the vertical direction instead of through the heat sink above the CPU 100, wherein such securement preferably occurs on an interface between the CPU 100 and the connector 200 rather than on an exterior side of the CPU 100 or the housing 1 of the connector 200. Because the stress applied upon the connector 200 is essentially shared by the securing mechanism in a dispersed manner in addition to the contacts 2, the housing 1 and the contacts 2 of the electrical connector 200 may be well protected without undesired damage/warpage due to the downward force applied by the heat sink clip (not shown) which is seated upon the CPU 100. Understandably, the securement between the first securing piece 101 and the second securing piece provides not only the securement between the CPU 100 and the connector 200 but also the upward support the CPU 100 to resist the downward force applied upon the heat sink (not shown) which is seated upon the CPU 100.

While a preferred embodiment in accordance with the present disclosure has been shown and described, equivalent modifications and changes known to persons skilled in the art according to the spirit of the present disclosure are considered within the scope of the present disclosure as described in the appended claims.

What is claimed is:

1. An electrical connector assembly comprising:
an electronic package equipped with a metallic first securing piece;
an electrical connector including an insulative housing with a receiving cavity to receive the electronic package therein, and a plurality of contacts retained to the housing with corresponding contacting sections upwardly extending into the receiving cavity for mechanical and electrical connection with the electronic package, and a metallic second securing piece attached upon the housing; wherein
the first securing piece and the second securing piece are locked with each other when the electronic package is completely received within the receiving cavity;
securement between the first securing piece and the second securing piece occurs on an interface between the electronic package and the housing around an undersurface of the electronic package; and
the securement is implemented by a plurality of hooks on one of the first securing piece and the second securing piece, and a plurality of tabs with therein corresponding locking holes on the other of the first securing piece and the second securing piece.

2. The electrical connector assembly as claimed in claim 1, wherein all the hooks extend in a same transverse direction so as to allow a horizontal or rotatable movement of the electronic package relative to the housing during coupling the first securing piece and the second securing piece together.

3. The electrical connector assembly as claimed in claim 1, wherein the first securing piece defines an H-shaped configuration in a top view, and the second securing piece defines a similar H-shaped configuration in the top view.

4. The electrical connector as claimed in claim 3, wherein the securement between the first securing piece and the second securing piece is dispersed on the whole H-shaped configuration.

5. The electrical connector as claimed in claim 3, wherein the first securing piece includes a pair of side arms linked with a transverse bar, and each of said side arms forms a U-shaped structure to receive a side portion of the electronic package.

6. The electrical connector as claimed in claim 5, wherein the transverse bar is located on the interface between the electronic package and the housing.

7. The electrical connector assembly as claimed in claim 3, wherein the second securing piece includes a pair of side arms linked with a transverse bar, and each of said side arms forms a U-shaped structure to receive a side portion of the housing of the connector.

8. The electrical connector as claimed in claim 7, wherein the transverse bar is located on the interface between the electronic package and the housing.

9. An electrical connector assembly comprising:
an electrical connector including an insulative housing with an upward facing receiving cavity for receiving an electronic package therein;
a plurality of contacts retained to the housing, each of said contacts including a resilient contacting section upwardly extending into the receiving cavity; and
a metallic piece attached upon the housing with means for providing an upward support to resist a downward force applied upon the electronic package and transferred to the contacting sections of the contacts;
wherein
the electronic package is equipped with another metallic piece aligned with and coupled to the metallic piece of the connector in a vertical direction.

10. The electrical connector assembly as claimed in claim 9, wherein the metallic piece includes a pair of side arms with said means thereon.

11. The electrical connector assembly as claimed in claim 10, wherein each side arm forms a U-shaped cross-section to receive a side portion of the housing.

12. The electrical connector assembly as claimed in claim 9, wherein the metallic piece includes a transverse bar, and the contacts are divided into two essentially equal groups with said transverse bar therebetween in a front-to-back direction perpendicular to a transverse direction defined by said transverse bar.

13. The electrical connector assembly as claimed in claim 12, wherein the metallic piece further includes a pair of side arms with said means thereon so as to cooperate with the transverse bar to form an H-shaped configuration in a top view in a vertical direction perpendicular to both the front-to-back direction and the transverse direction.

14. The electrical connector assembly as claimed in claim 9, wherein the metallic piece of the connector and said another metallic piece are secured to each other in the vertical direction.

15. An electrical connector assembly comprising:
an electronic package; and
an electrical connector including an insulative housing with a receiving cavity to receive the electronic package therein, and a plurality of contacts retained to the housing with corresponding contacting sections upwardly extending into the receiving cavity for mechanical and electrical connection with the electronic package; wherein
said electronic package is equipped with a metallic securing piece having a plurality of extensions in a vertical direction to support the electronic package upon the housing in the vertical direction.

16. The electrical connector assembly as claimed in claim 15, wherein the housing is equipped with another metallic piece aligned and coupled with the metallic piece in the vertical direction.

17. The electrical connector assembly as claimed in claim 16, wherein said metallic piece of the electronic package and said another metallic piece of the connector are secured to each other in the vertical direction.

18. An electrical connector assembly comprising:
an electronic package equipped with a metallic first securing piece; and
an electrical connector including an insulative housing with a receiving cavity to receive the electronic package therein, a plurality of contacts retained to the housing with corresponding contacting sections upwardly extending into the receiving cavity for mechanical and electrical connection with the electronic package, and a metallic second securing piece attached upon the housing; wherein
the first securing piece and the second securing piece are locked with each other when the electronic package is completely received within the receiving cavity; and
the first securing piece defines an H-shaped configuration in a top view, and the second securing piece defines a similar H-shaped configuration in the top view.

19. An electrical connector assembly comprising:
an electrical connector including an insulative housing with an upward facing receiving cavity for receiving an electronic package therein;
a plurality of contacts retained to the housing, each of said contacts including a resilient contacting section upwardly extending into the receiving cavity; and
a metallic piece attached upon the housing with means for providing an upward support to resist a downward force applied upon the electronic package and transferred to the contacting sections of the contacts; wherein
the metallic piece includes a pair of side arms with said means thereon.

20. An electrical connector assembly comprising:
an electrical connector including an insulative housing with an upward facing receiving cavity for receiving an electronic package therein;
a plurality of contacts retained to the housing, each of said contacts including a resilient contacting section upwardly extending into the receiving cavity; and
a metallic piece attached upon the housing with means for providing an upward support to resist a downward force applied upon the electronic package and transferred to the contacting sections of the contacts; wherein
the metallic piece includes a transverse bar, and the contacts are divided into two essentially equal groups with said transverse bar therebetween in a front-to-back direction perpendicular to a transverse direction defined by said transverse bar.

* * * * *